(12) United States Patent
Hong et al.

(10) Patent No.: US 10,008,156 B2
(45) Date of Patent: Jun. 26, 2018

(54) DISPLAY DEVICE INCLUDING POWER LINK LINE

(71) Applicant: LG DISPLAY CO., LTD., Seoul (KR)

(72) Inventors: Young-Jun Hong, Gyeonggi-do (KR); Kyoung-Don Woo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 426 days.

(21) Appl. No.: 13/726,990

(22) Filed: Dec. 26, 2012

(65) Prior Publication Data

US 2014/0071107 A1 Mar. 13, 2014

(30) Foreign Application Priority Data

Sep. 12, 2012 (KR) .......................... 10-2012-0100789

(51) Int. Cl.
  *G09G 3/3291* (2016.01)
  *G09G 3/3225* (2016.01)
  *H01L 27/32* (2006.01)
  *G09G 3/36* (2006.01)

(52) U.S. Cl.
  CPC ......... *G09G 3/3291* (2013.01); *G09G 3/3225* (2013.01); *H01L 27/3276* (2013.01); *G09G 3/3648* (2013.01); *G09G 2300/0426* (2013.01); *G09G 2300/0809* (2013.01); *G09G 2300/0842* (2013.01); *G09G 2330/08* (2013.01)

(58) Field of Classification Search
  CPC ... G09G 3/3291; G09G 3/3225; G09G 3/3648
  See application file for complete search history.

(56) References Cited

U.S. PATENT DOCUMENTS

| 2001/0043168 A1* | 11/2001 | Koyama | G09G 3/3225 345/52 |
|---|---|---|---|
| 2004/0084740 A1 | 5/2004 | Hayashi | |
| 2004/0100608 A1 | 5/2004 | Matsueda et al. | |

(Continued)

FOREIGN PATENT DOCUMENTS

| DE | 10 2011 057 016 A1 | 6/2012 |
|---|---|---|
| JP | 2002-032037 A | 1/2002 |

(Continued)

OTHER PUBLICATIONS

German Office Action dated Jul. 10, 2013 for German Patent Application No. 10 2012 112 291.1.

(Continued)

*Primary Examiner* — Lisa Landis
(74) *Attorney, Agent, or Firm* — Morgan, Lewis & Bockius LLP

(57) ABSTRACT

There is provided a display device including: a display panel including a display area consisting of a plurality of pixel areas, and a non-display area surrounding the display area; a plurality of power lines formed on the display area to supply a first voltage to the plurality of pixel areas; a first power link line connected to the plurality of first power lines, and formed on the non-display area; and a plurality of drivers connected to the display panel, and including a plurality of output pads and a plurality of first power pads, the plurality of (first) power pads disposed between the plurality of output pads and respectively connected to the plurality of first power link lines.

18 Claims, 9 Drawing Sheets

(56) References Cited

U.S. PATENT DOCUMENTS

| | | | |
|---|---|---|---|
| 2006/0139255 A1* | 6/2006 | Kim | G09G 3/3233 345/76 |
| 2007/0035485 A1 | 2/2007 | Yoon | |
| 2008/0284697 A1* | 11/2008 | Nam | G02F 1/1345 345/87 |
| 2009/0231821 A1* | 9/2009 | Osawa | B41J 2/04523 361/767 |
| 2012/0044221 A1 | 2/2012 | Ko et al. | |
| 2012/0162053 A1 | 6/2012 | Lee et al. | |
| 2013/0335123 A1* | 12/2013 | Choi | H03K 17/165 327/109 |

FOREIGN PATENT DOCUMENTS

| | | |
|---|---|---|
| JP | 2004-127924 A | 4/2004 |
| JP | 2004-152901 A | 5/2004 |
| JP | 2007-134357 A | 5/2007 |
| JP | 2008-020529 A | 1/2008 |
| JP | 2008-052000 A | 3/2008 |
| JP | 2009-128566 * | 6/2009 |
| JP | 2009-128566 A | 6/2009 |
| JP | 2009-175389 A | 8/2009 |
| JP | 2011-248218 A | 12/2011 |
| JP | 2012-042910 A | 3/2012 |
| KR | 10-2007-0019413 A | 2/2007 |
| KR | 10-2011-0070165 A | 6/2011 |

OTHER PUBLICATIONS

Korean Office Action dated Oct. 31, 2013 for corresponding Patent Application No. 10-2012-0100789.

Japanese Office Action dated Aug. 14, 2014 for corresponding Japanese Patent Application No. 2013-189254.

Office Action dated Mar. 26, 2015 from the Japanese Patent Office in counterpart Japanese patent application 2013-189254.

* cited by examiner

US 10,008,156 B2

DISPLAY DEVICE INCLUDING POWER LINK LINE

The present application claims the priority benefit of Korean Patent Application No. 10-2012-0100789 filed in the Republic of Korea on Sep. 12, 2012, which is hereby incorporated by reference in its entirety.

BACKGROUND

Field of the Disclosure

The present disclosure relates to a display device, and more particularly, to a display device including power link lines formed between the output pads of a driving integrated circuit.

Discussion of the Related Art

An organic light-emitting diode (OLED) which is one of flat panel displays (FPDs), has the characteristics of high brightness and a low operating voltage.

The OLED has a high contrast ratio since it is a self-luminous device, can be implemented as an ultra thin display, can easily reproduce moving pictures due to its response time of several microseconds (μs), has no limitation of a viewing angle, and can stably operate at a low temperature. Also, since the OLED can be driven at a low direct current voltage of 5V to 15V, it is easy to manufacture and design a driving circuit with the OLED.

Furthermore, the OLED can be manufactured through a simple manufacturing process including only deposition and encapsulation.

However, since the OLED is a current mode of emitting light by supplying current to light-emitting diodes, it is necessary to supply various high voltages to individual pixel areas through an integrated power line.

The integrated power line of the OLED will be described with reference to FIGS. 1 and 2, below.

FIG. 1 shows an example of a conventional OLED display device 10, and FIG. 2 is an enlarged view of an area A of FIG. 1.

As shown in FIG. 1, the conventional OLED display device 10 includes a light-emitting diode panel 15 that displays images, and a plurality of gate drivers (not shown) and a plurality of data drivers 20 connected to the light-emitting diode panel 15 to supply gate signals and data signals, respectively.

The light-emitting diode panel 15 includes a display area DA consisting of a plurality of pixel areas P, and a non-display area NDA surrounding the display area DA. The display area DA includes a plurality of first power lines 54 for supplying a first voltage to the pixel areas P, and the non-display area NDA includes first integrated power lines 50 connected to the first power lines 54 to transfer the first voltage from an external source to the first power lines 54.

Although not shown in the drawings, the display area DA includes a plurality of second power lines for supplying a second voltage to the pixel areas P, and the non-display area NDA includes second integrated lines 52 connected to the second power lines to transfer the second voltage from an external source to the second power lines.

Each data driver 20 may be formed in the form of a chip on film (COF) in which a driving integrated circuit (DIC) 22 is mounted on a film, like a tape carrier package (TCP).

First power supply lines 40 to which the first voltage from the external source is supplied, are formed at both ends of the data driver 20, and the first power supply lines 40 are connected to one of the first integrated power line 50.

Also, a secondary driver 30 such as a film on glass (FOG) may be connected to the light-emitting diode panel 15, and a second power supply line 42 is connected to the secondary driver 30 and to one of the second integrated power lines 52.

In more detail, as shown in FIG. 2, the driving integrated circuit 22 of the data driver 20 includes a plurality of digital-analog converters DAC1, DAC2, DAC3, and DAC4, a plurality of buffers BF1, BF2, BF3, and BF4, and a plurality of output pads OP1, OP2, OP3, and OP4. The digital-analog converters DAC1, DAC2, DAC3, and DAC4, the buffers BF1, BF2, BF3, and BF4, and the output pads OP1, OP2, OP3, and OP4 are connected 1:1:1 to each other, and the output pads OP1, OP2, OP3, and OP4 are connected to a plurality of data lines 60 of the light-emitting diode panel 15.

Also, a plurality of data signals created by the digital-analog converters DAC1, DAC2, DAC3, and DAC4 are supplied to the data lines 60 through the buffers BF1, BF2, BF3, and BF4, and the output pads OP1, OP2, OP3, and OP4.

Also, the first power supply lines 40 are formed at both ends of the data driver 20, a power input pad 40*a* and a power output pad 40*b* are formed at both ends of each first power supply line 40, and the power output pad 40*b* is connected to the first integrated power line 50 of the light-emitting diode pad 15.

Meanwhile, a plurality of first power lines 54 are formed between the pixel areas P1, P2, P3, and P4 of the light-emitting diode panel 15, and the first power lines 54 are connected to the first integrated power line 50 to receive the first voltage from the first integrated power line 50.

FIG. 3 shows another example of a conventional OLED display device.

As shown in FIG. 3, the conventional OLED display device according to the other example includes a light-emitting panel 115 that displays images, and a plurality of gate drivers (not shown) and a plurality of data drivers 120 connected to the light-emitting diode panel 115 to supply gate signals and data signals, respectively.

The light-emitting diode panel 115 includes a display area DA consisting of a plurality of pixel areas P, and a non-display area NDA surrounding the display area DA. The display area DA includes a plurality of first power lines 154 and a plurality of second power lines (not shown) for supplying first and second voltages to the pixel areas P, and the non-display area NDA includes first integrated power lines 150 connected to the first power lines 154 to transfer the first voltage from an external source to the first power lines 154, and second integrated power lines 152 connected to the second power lines to transfer the second voltage from an external source to the second power lines.

Each data driver 120 may be formed in the form of a COF in which a driving integrated circuit (DIC) 22 is mounted on a film, like a TCP.

First external power lines 140 to which the first voltage from the external source is supplied, and second external power lines 142 to which the second voltage from the external is supplied, are formed at both ends of the data driver 120, and the first and second external power lines 140 and 142 are connected to ones of the first and second integrated power lines 150 and 152, respectively.

In the conventional OLED display devices 10 and 110, the first and second voltages may be a supply voltage VDD and a ground voltage VSS, respectively. Since the first and second voltages may be supplied to all pixel areas P of the light-emitting diode panels 15 and 115 through ones of the first integrated power lines 50 and 150 and ones of the second integrated power lines 52 and 152, an excessive amount of current comes to flow through the first integrated power lines 50 and 150 and the second integrated power lines 52 and 152.

Accordingly, the first integrated power lines 50 and 150 and the second integrated power lines 52 and 152 may be electrically open or burned, or electrically shorted with other lines due to the breakdown of their upper and lower insulating layers. The failure of the first integrated power lines 50 and 150 and the second integrated power lines 52 and 152 is propagated to the first power lines 54 and 154 and the second power lines.

In particular, in the case of a large size display requiring a larger amount of driving current, such a failure becomes a serious problem.

SUMMARY OF THE INVENTION

Accordingly, the present invention is directed to a display device that substantially obviates one or more of the problems due to limitations and disadvantages of the related art.

An object of the present disclosure is to provide a display device including a power link line, capable of preventing a failure such as an electrical shortage or burning by forming a plurality of power link lines between a plurality of output pads of a driving integrated circuit, and connecting a part of a plurality of power lines to each power link line to divide a voltage and supply the divided voltage.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a display device, including: a display panel including a display area consisting of a plurality of pixel areas, and a non-display area surrounding the display area; a plurality of power lines formed on the display area to supply a first voltage to the plurality of pixel areas; a first power link line connected to the plurality of first power lines, and formed on the non-display area; and a plurality of drivers connected to the display panel, and including a plurality of output pads and a plurality of first power pads, the plurality of power pads disposed between the plurality of output pads and respectively connected to the plurality of first power link lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
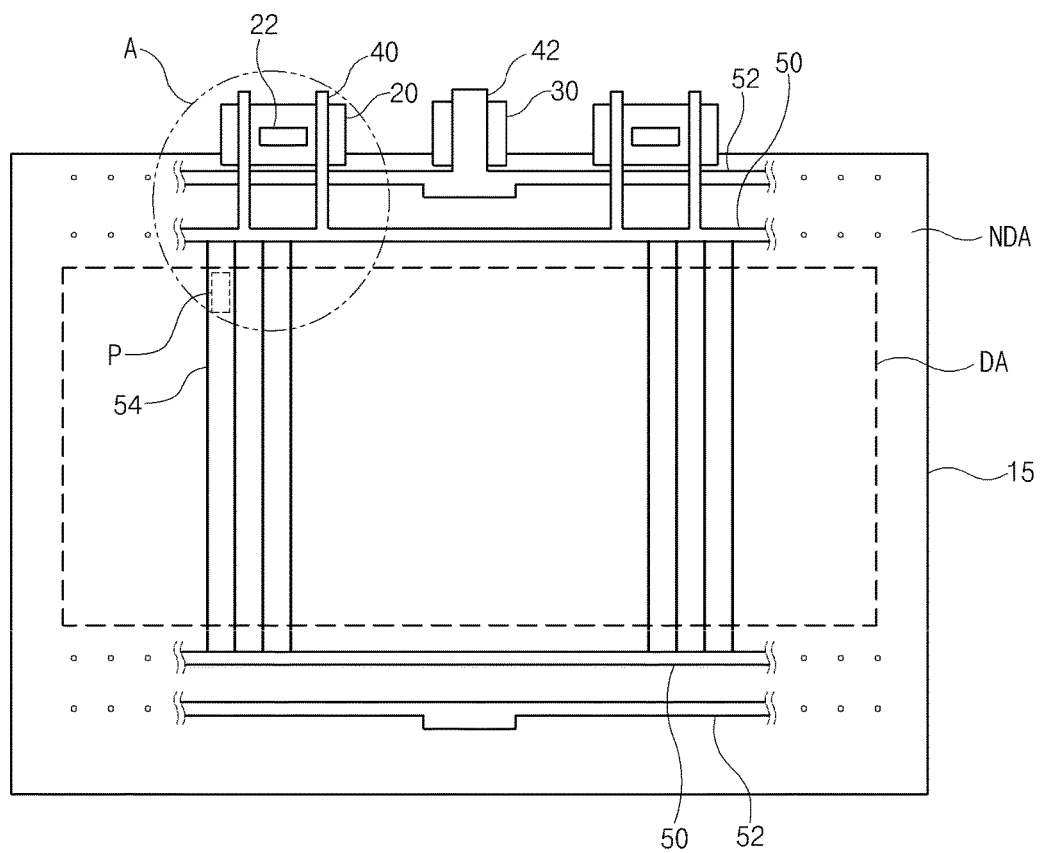
FIG. 1 shows an example of a conventional organic light-emitting diode (OLED) display device.
Figure 2:
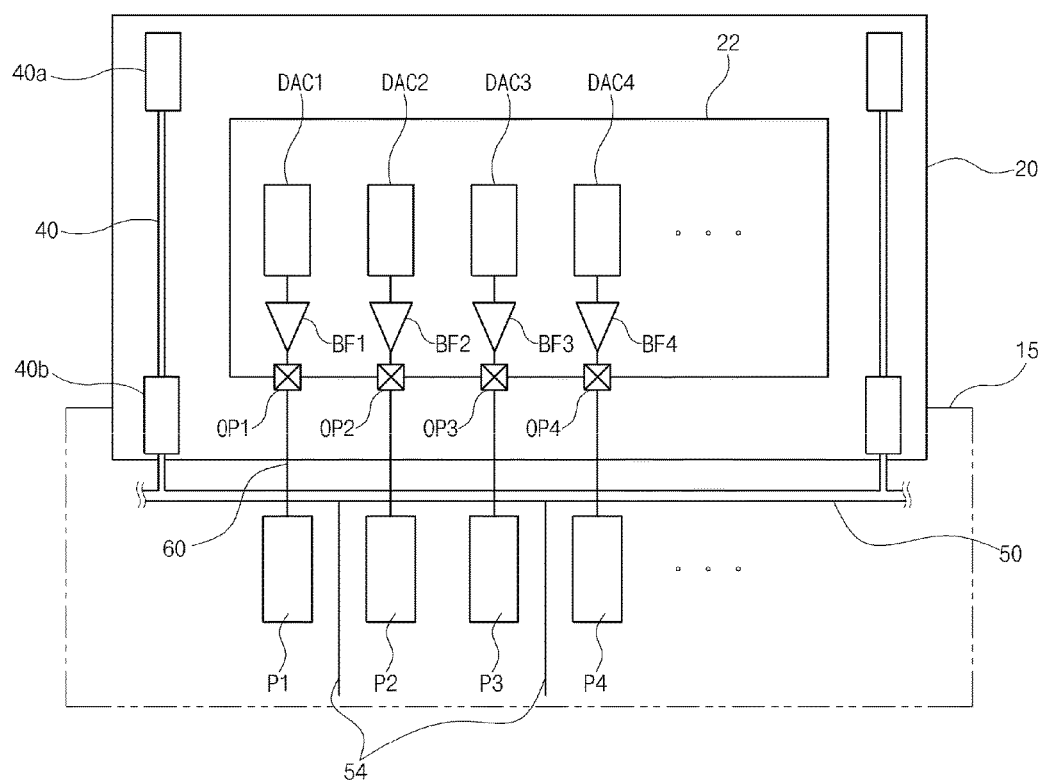
FIG. 2 is an enlarged view of an area A of FIG. 1.
Figure 3:
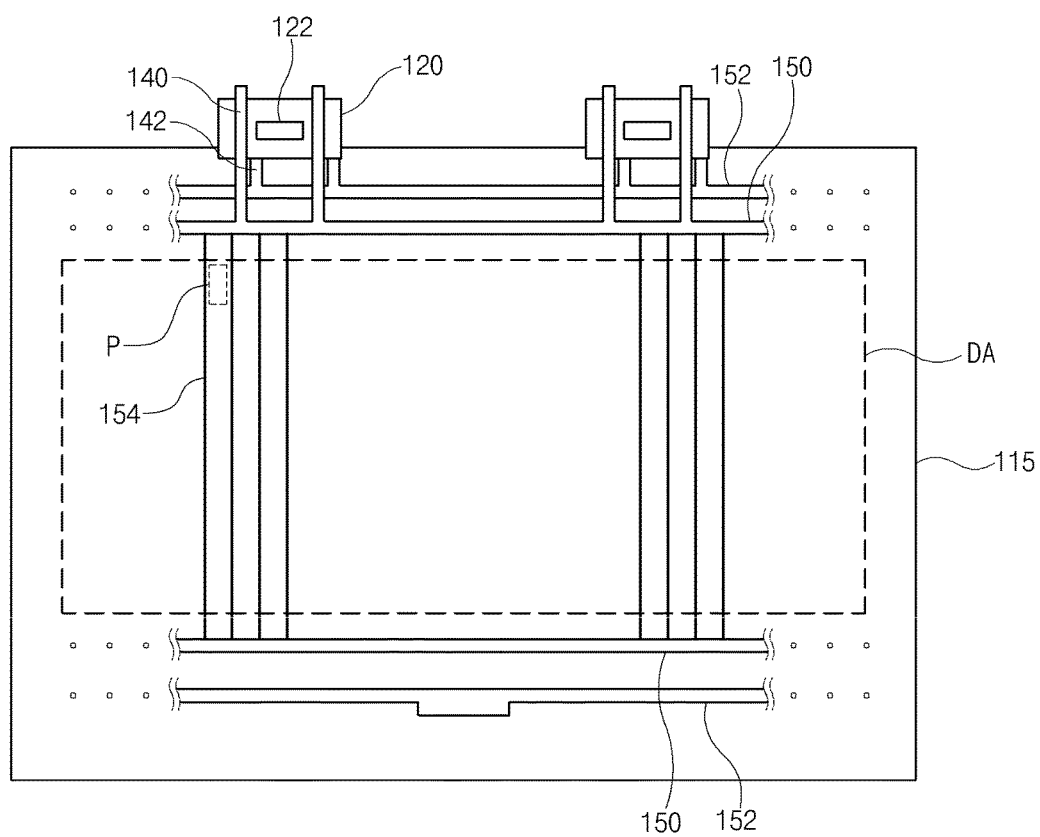
FIG. 3 shows another example of a conventional OLED display device.
Figure 4:
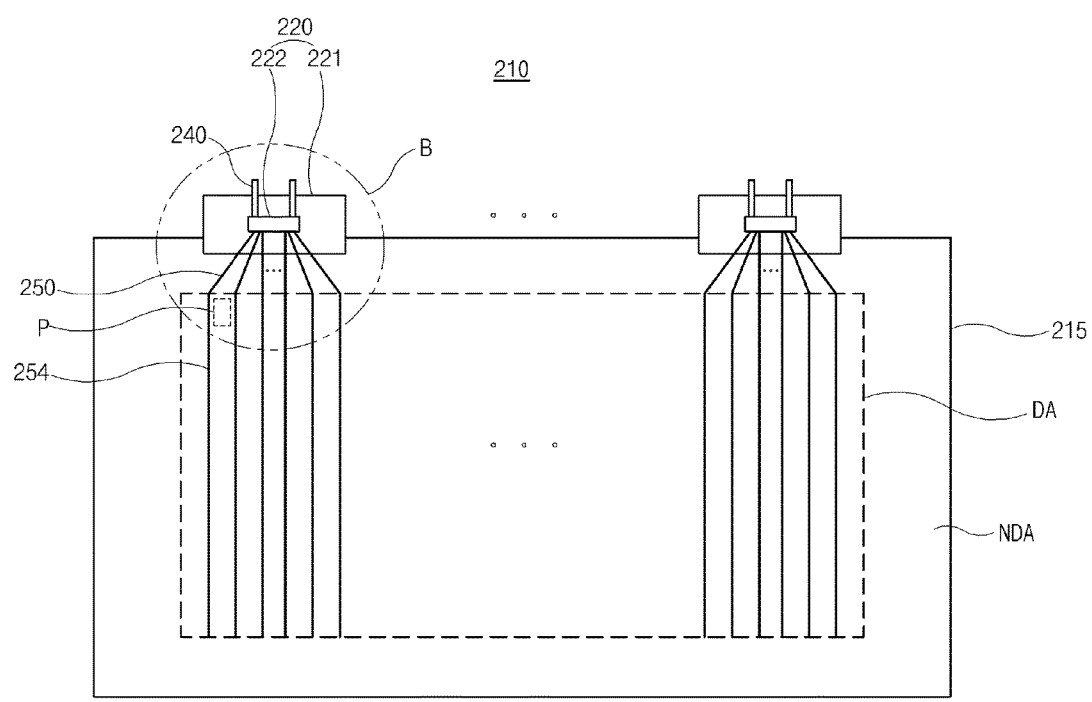
FIG. 4 shows an OLED display device according to a first embodiment of the present invention.
Figure 5:
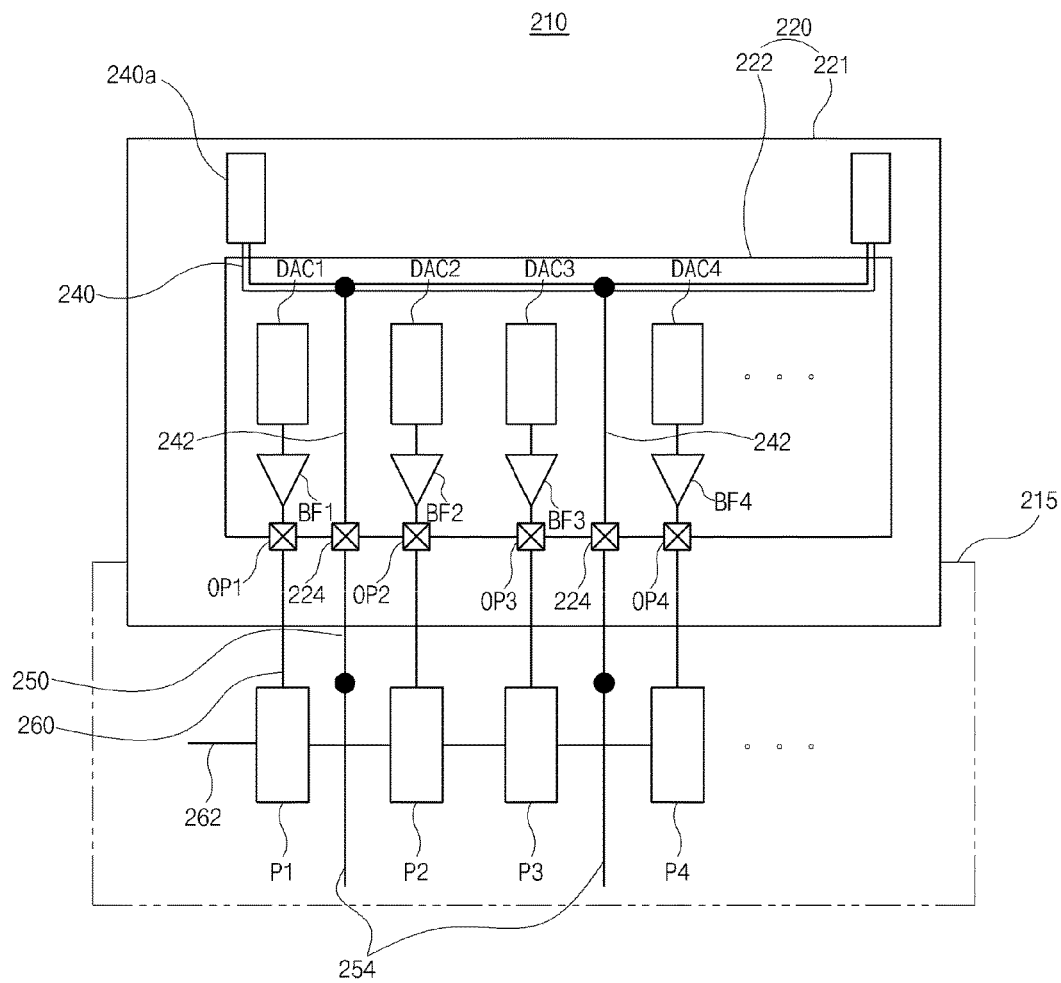
FIG. 5 is an enlarged view of an area B of FIG. 4.

FIG. 4 shows an organic light-emitting diode (OLED) display device 210 according to a first embodiment of the present invention, and FIG. 5 is an enlarged view of an area B of FIG. 4.

As shown in FIG. 4, the OLED display device 210 according to the first embodiment of the present invention includes a light-emitting diode panel 215 that displays images, and a plurality of gate drivers (not shown) and a plurality of data drivers 220 connected to the light-emitting diode panel 215 to supply gate signals and data signals, respectively.

The light-emitting diode panel 215 includes first and second substrates (not shown) that have a display area DA consisting of a plurality of pixel areas P and a non-display area NDA surrounding the display area DA. In the display area DA of the first substrate, a plurality of first power lines 254 for supplying a first voltage to the plurality of pixel areas P are formed in the vertical direction of the light-emitting diode panel 215, and in the non-display area NDA of the first substrate, a plurality of first power link lines 250 connected to the first power lines 254 to transfer the first voltage from an external source to the first power lines 254 are formed.

Although not shown in FIGS. 4 and 5, a plurality of second power lines for supplying a second voltage to the pixel areas P may be additionally formed in the display area DA of the first substrate, and a plurality of second power link lines connected to the second power lines to transfer the second voltage from an external source to the second power lines may be additionally formed in the non-display area (NDA) of the first substrate.

Each data driver 220 may be formed in the form of a COF in which a driving integrated circuit (DIC) 222 is mounted on a film 221, like a TCP.

A first power supply line 240 to which the first voltage from the external source is supplied is formed on the film 221 of each data driver 220, the first power supply line 240 is connected to the first voltage link lines 250, and each of the first power link lines 250 is configured by connection of a first part formed on the first substrate of the light-emitting diode panel 215 and a second part formed on the film 221 of the data driver 220.

Also, although not shown in FIGS. 4 and 5, a plurality of second power supply lines to which the second voltage from the external source is supplied may be additionally formed in the data drivers 220, and the second power supply lines may be respectively connected to the second power link lines.

In more detail, as shown in FIG. 5, the DIC 222 of each data driver 220 includes a plurality of digital-analog converters DAC1, DAC2, DAC 3, and DAC4, a plurality of buffers BF1, BF2, BF3, and BF4, and a plurality of output terminals (not shown), which are connected 1:1:1 to each other. The output terminals are connected to a plurality of output pads OP1, OP2, OP3, and OP4 formed on the film 221 of the data driver 220, and the plurality of output pads OP1, OP2, OP3, and OP4 are respectively connected to a plurality of data lines 260 of the light-emitting diode panel 215.

A plurality of data signals created by the digital-analog converters DAC1, DAC2, DAC3, and DAC4 are respectively supplied to the data lines 260 through the buffers BF1, BF2, BF3, and BF4 and the output pads OP1, OP2, OP3, and OP4.

Also, the first power supply line 240 is formed on the film 221 of the data driving unit 220, power input pads 240a are formed at both ends of the first power supply line 240, a plurality of first secondary power link lines 242 are connected to the first power supply line 240, one ends of the first secondary power link lines 242 are positioned on the film 221 and connected to a plurality of first power pads 224 disposed between the output pads OP1, OP2, OP3, and OP4, and the first power pads 224 are respectively connected to a plurality of power link lines 250 of the light-emitting diode panel 215.

The first secondary power link lines 242 may be formed on the film 221 of the data driver 220, or in the DIC 222 of the data driver 220.

Meanwhile, the first power lines 254 are disposed between the pixel areas P1, P2, P3, and P4 of the first substrate of the light-emitting diode panel 215, and the first power lines 254 are connected to the first power link lines 250 to receive the first voltage.

The neighboring two of the pixel areas P1, P2, P3, and P4 may receive the first voltage through the same first power line 254, and the pixel areas P1, P2, P3, and P4 may include red (R), white (W), green (G), and blue (B) pixel areas.

As such, in the OLED display device 210 according to the first embodiment of the present invention, the first power link lines 250 are formed in correspondence to two of the plurality of output pads OP1, OOP2, OP3, and OP4 of the DIC 222 of the data driver 220, and the first power link lines 250 are respectively connected to the first power lines 254 of the light-emitting diode panel 215 to receive the first voltage.

Although not shown in the drawings, the OLED display device 210 may include the second power link lines, and in this case, the second power link lines may be formed in correspondence to two of the output pads OP1, OP2, OP3, and OP4 of the DIC 222, and the second power link lines are respectively connected to the second power lines of the light-emitting diode panel 215 to receive the second voltage.

In this case, the first and second power link lines may be arranged alternately, one by one, or two by two, in the horizontal direction of the light-emitting diode panel 215. For example, the first and second power link lines may be arranged in a predetermined order, such as (1, 1, 2, 2, . . . ), or such as (1, 2, 1, 2, . . . ).

Since each first power link line 250 is connected to a part (for example, one first power line 254) of the first power lines 254 of the light-emitting diode panel 215, the current of the first voltage required by the light-emitting diode panel 215 is divided by the number of the first power link lines 250 in the horizontal direction, and as a result, failure of the first power link lines 250 or the first power lines 254, such as an electrical breakdown, combustion, or an electrical shortage, can be prevented.

Meanwhile, another embodiment in which power link lines are formed in correspondence to four output pads of a DIC is proposed. The embodiment will be described with reference to a drawing, below.

Figure 6:
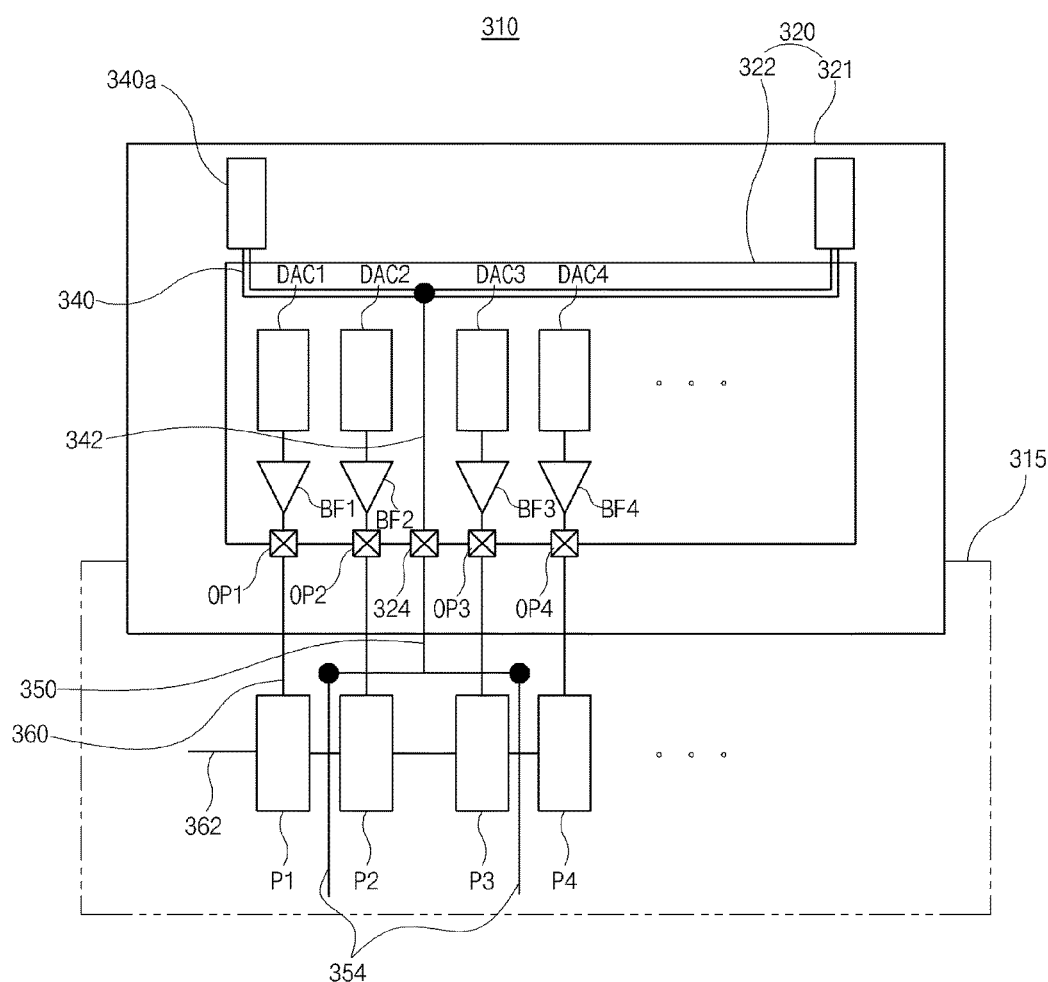
FIG. 6 shows a part of an OLED display device according to a second embodiment of the present invention.

FIG. 6 shows a part of an OLED display device 310 according to a second embodiment of the present invention.

As shown in FIG. 6, the OLED display device 310 according to the second embodiment of the present invention includes a light-emitting diode panel 315, a plurality of gate drivers (not shown), and a plurality of data drivers 320.

The data driver 320 includes a film 321, and a DIC mounted on the film 321.

The DIC 322 includes a plurality of digital-analog converters DAC1, DAC2, DAC3, and DAC4, a plurality of buffers BF1, BF2, BF3, and BF4, and a plurality of output terminals (not shown), which are connected 1:1:1 to each other. The plurality of output terminals are connected to a plurality of output pads OP1, OP2, OP3, and OP4 formed on the film 321, and the output pads OP1, OP2, OP3, and OP4 are respectively connected to a plurality of data lines 360 on the first substrate (not shown) of the light-emitting diode panel 315.

A plurality of data signals created by the digital-analog converters DAC1, DAC2, DAC3, and DAC4 are respectively supplied to the data lines through the buffers BF1, BF2, BF3, and BF4, and the output pads OP1, OP2, OP3, and OP4.

Also, a first power supply line 340 is formed on the film 321, power input pads 340a are formed at both ends of the first power supply line 340, a plurality of first secondary power link lines 342 are connected to the first power supply line 340, one ends of the first secondary power link lines 342 are disposed on the film 321 and respectively connected to a plurality of first power pads 324 disposed between the output pads OP1, OP2, OP3, and OP4, and the first power pads 324 are respectively connected to a plurality of first power link lines 350 of the light-emitting diode panel 315.

The first secondary power link lines 342 may be formed on the film 321, or in the DIC 322.

Meanwhile, a plurality of first power lines 354 are formed between a plurality of pixel areas P1, P2, P3, and P4 of the first substrate of the light-emitting diode panel 315, and the first power lines 354 are connected to the first power link lines 350 to receive a first voltage.

Here, the neighboring two of the pixel areas P1, P2, P3, and P4 receive the first voltage through the same first power line 354 shared by the corresponding pixel areas, and the pixel areas P1, P2, P3, and P4 may include red (R), white (W), green (G), and blue (B) pixel areas.

As such, in the OLED display device 310 according to the second embodiment of the present invention, each first power link line 350 is formed in correspondence to the four output pads OP1, OP2, OP3, and OP4 of the DIC 322 of the data driver 320, and the first power link line 350 is connected to the first power lines 354 of the light-emitting diode panel 315 to supply the first voltage to the first power lines 354.

Although not shown in FIG. 6, the OLED display device 310 may further include a plurality of second power link lines and a plurality of third power link lines, and in this case, the second power link lines and the third power link lines may be formed in correspondence to the four output pads OP1, OP2, OP3, and OP4 of the DIC 322, and the second power link lines and the third power link lines may be connected to the second power lines and the third power lines of the light-emitting diode panel 315, respectively, to supply a second voltage and a third voltage to the second power lines and the third power lines, respectively.

In this case, the first through third power link lines may be arranged alternately, one by one, or, three by three, in the horizontal direction. For example, the first through third power link lines may be arranged in a predetermined order, such as (1, 1, 1, 2, 2, 2, 3, 3, 3, . . . ) or (1, 2, 3, 1, 2, 3, 1, 2, 3, . . . ).

Since each first power link line 350 is connected to a part (for example, two first power lines 354) of the first power lines 354 of the light-emitting diode panel 315, the current of the first voltage required by the light-emitting diode panel 315 is divided by the number of the first power link lines 350 in the horizontal direction, and as a result, failure of the first power link lines 350 or the first power lines 354, such as an electrical breakdown, combustion, or an electrical shortage, can be prevented.

As described above, in the first embodiment, a first power link line 250 and a power pad 224 are formed in correspondence to two output pads, and in the second embodiment, a first power link line 350 and a power pad 324 are formed in correspondence to four output pads. However, according to other embodiments, a first power link line and a power pad may be formed in correspondence to an output pad, or in correspondence to all of a plurality of output pads.

That is, each of a first power link line and a power pad may be formed to have a number equal to or greater than one and equal to or smaller than the total number of the plurality of output pads, in consideration of the efficiency of dividing the first voltage and supplying the divided voltages.

Meanwhile, according to another embodiment, power link lines may be formed in a gate driver, and the embodiment will be described with reference to a drawing, below.

Figure 7:
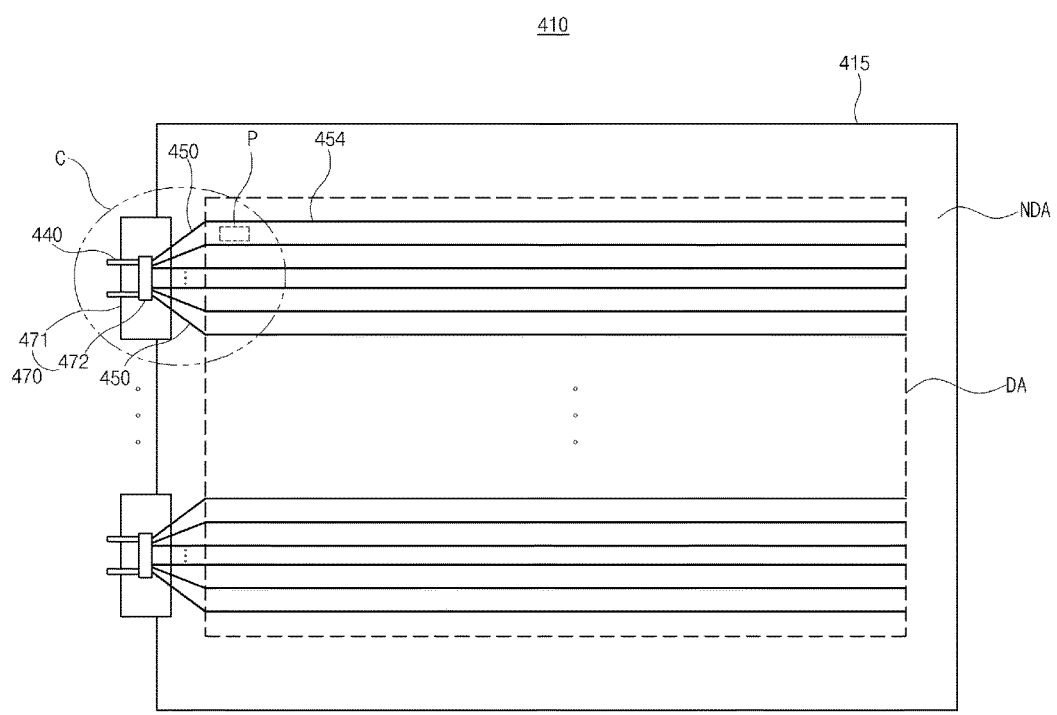
FIG. 7 shows an OLED display device according to a third embodiment of the present invention.
Figure 8:
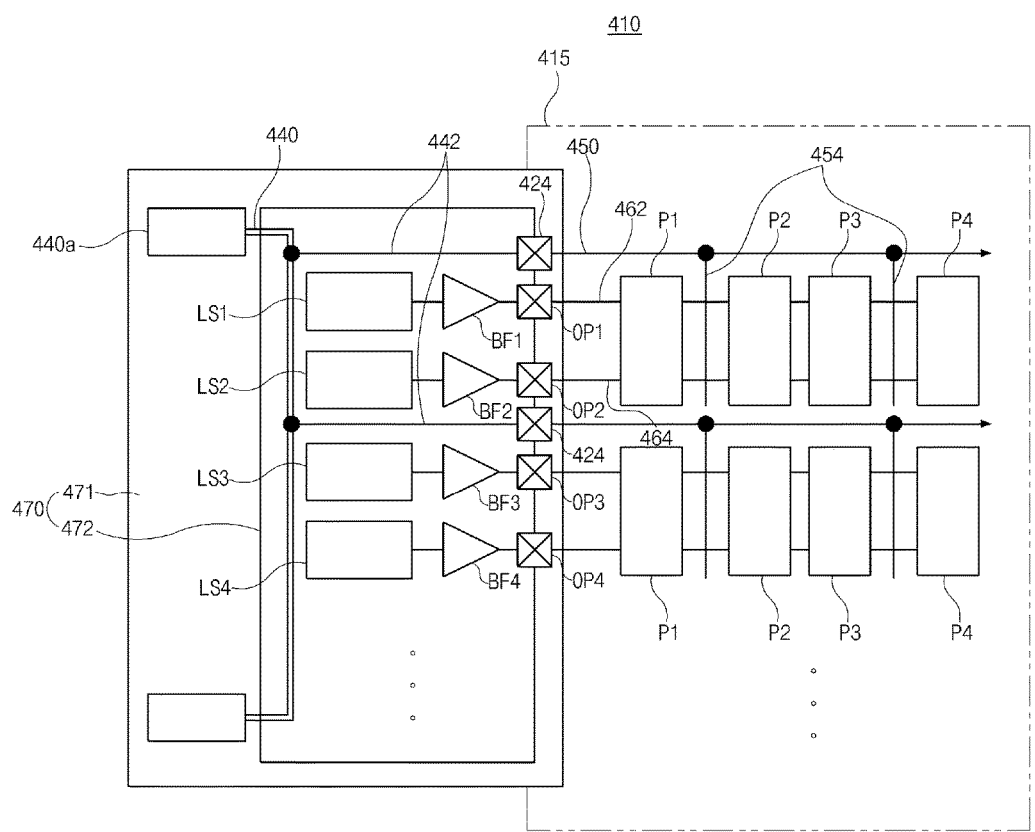
FIG. 8 is an enlarged view of an area C of FIG. 7.

FIG. 7 shows an OLED display device 410 according to a third embodiment of the present invention, and FIG. 8 is an enlarged view of an area C of FIG. 7.

As shown in FIG. 7, the OLED display device 410 according to the third embodiment of the present invention includes a light-emitting diode panel 415 that displays images, and a plurality of gate drivers 470 and a plurality of data drivers (not shown) connected to the light-emitting diode panel 415 to supply gate signals and data signals, respectively.

The light-emitting diode panel 415 includes first and second substrates (not shown) that have a display area DA consisting of a plurality of pixel areas P, and a non-display area NDA surrounding the display area DA. In the display area DA of the first substrate, a plurality of first power lines 454 for supplying a first voltage to the plurality of pixel areas P are formed in the vertical direction of each pixel area P, and in the non-display area NDA of the first substrate, a plurality of first power link lines 450 connected to the first power lines 454 to transfer the first voltage from an external source to the first power lines 454 are formed.

Although not shown in FIGS. 7 and 8, a plurality of second power lines for supplying a second voltage to the pixel areas P may be additionally formed in the display area DA of the first substrate, and a plurality of second power link lines connected to the second power lines to transfer the second voltage from an external source to the second power lines may be additionally formed in the non-display area (NDA) of the first substrate.

Each gate driver 470 may be formed in the form of a COF in which a DIC 472 is mounted on a film 471, like a tape carrier package TCP.

A first power supply line 440 to which the first voltage from the external source is supplied is formed on the film 471 of each gate driver 470, the first power supply line 440 is connected to the first power link lines 450, and each first power link line 450 is configured by connecting a part formed on the first substrate of the light-emitting diode panel 415 to the corresponding part formed on the film 421 of the gate driver 420.

Also, although not shown in FIGS. 7 and 8, a plurality of second power supply lines to which the second voltage from the external source is supplied, may be additionally formed in the gate drivers 470, and the second power supply lines may be respectively connected to the second power link lines.

In more detail, as shown in FIG. 8, the DIC 472 of the gate driver 470 includes a plurality of shift registers (not shown), a plurality of level shifters LS2, LS2, LS3, and LS4, a plurality of buffers BF1, BF2, BF3, and BF4, and a plurality of output terminals (not shown), which are connected 1:1:1:1 to each other. The output terminals are connected to a plurality of output pads formed on the film 471 of the gate driver 470, and the output pads OP1, OP2, OP3, and OP4 are connected to a plurality of gate lines 462 and a plurality of reset lines 464 of the light-emitting diode panel 415.

A plurality of gate signals and a plurality of reset signals generated by the shift registers (not shown) and the level shifters LS1, LS2, LS3, and LS4 are respectively supplied to the gate lines 462 and the reset lines 464 through the buffers BF1, BF2, BF3, and BF4, and the output pads OP1, OP2, OP3, and OP4.

Also, the first power supply line 440 is formed on the film 471 of the gate driver 470, power input pads 440a are formed at both ends of the first power supply line 440, a plurality of first secondary power link lines 442 are connected to the first power supply line 440, one ends of the first secondary power link lines 442 are positioned on the film 421, the other ends of the first secondary power link lines 442 are connected to a plurality of first power pads 424 disposed between the output pads OP1, OP2, OP3, and OP4, and the first power pads 424 are respectively connected to a plurality of first power link lines 450 of the light-emitting diode panel 415.

The first secondary power link lines 442 may be formed on the film 471 of the gate driver 470, or in the DIC 472 of the gate driver.

Meanwhile, a plurality of first power lines 454 are formed between the pixel areas P1, P2, P3, and P4 of the first substrate of the light-emitting diode panel 415, and the first power lines 454 are connected to the first power link lines 450 to receive the first voltage.

The neighboring two of the pixel areas P1, P2, P3, and P4 can receive the first voltage through a first power line 454 shared by the corresponding pixel areas, and the pixel areas P1, P2, P3, and P4 may include red (R), white (W), green (G), and blue (B) pixel areas.

As such, in the OLED display device 410 according to the third embodiment, each first power link line 450 is formed in correspondence to two of the output pads OP1, OP2, OP3, and OP4 of the DIC 472 of the gate driver 470, and the first power link lines 450 are connected to the first power lines 454 of the light-emitting diode panel 415 to supply the first voltage to the first power lines 454.

Although not shown in FIGS. 7 and 8, the OLED display device 410 may further include a plurality of second power link lines. In this case, each second power link line may be formed in correspondence to two of the output pads OP1, OP2, OP3, and OP4 of the DIC 422 of the gate driver 470, and the second power link lines are connected to the second power lines of the light-emitting diode panel 415 to supply the second voltage to the second power lines.

Also, the first and second power link lines may be arranged alternately, one by one, or two by two, in the horizontal direction. For example, the first and second power link lines may be arranged in a predetermined order, such as (1, 1, 2, 2, . . . ) or (1, 2, 1, 2, . . . ).

Since each first power link line 450 is connected to a part (for example, first power lines 454 corresponding to pixel areas on a horizontal line) of the first power lines 454 of the light-emitting diode panel 415, the current of the first voltage required by the light-emitting diode panel 415 is divided by the number of the first power link lines 450 in the vertical direction, and as a result, failure of the first power link lines 450 or the first power lines 454, such as an electrical breakdown, combustion, or an electrical shortage, can be prevented.

Hereinafter, voltages that are supplied to the light-emitting diode panels according to the first, second, and third embodiments will be described with reference to a drawing, below.

Figure 9:
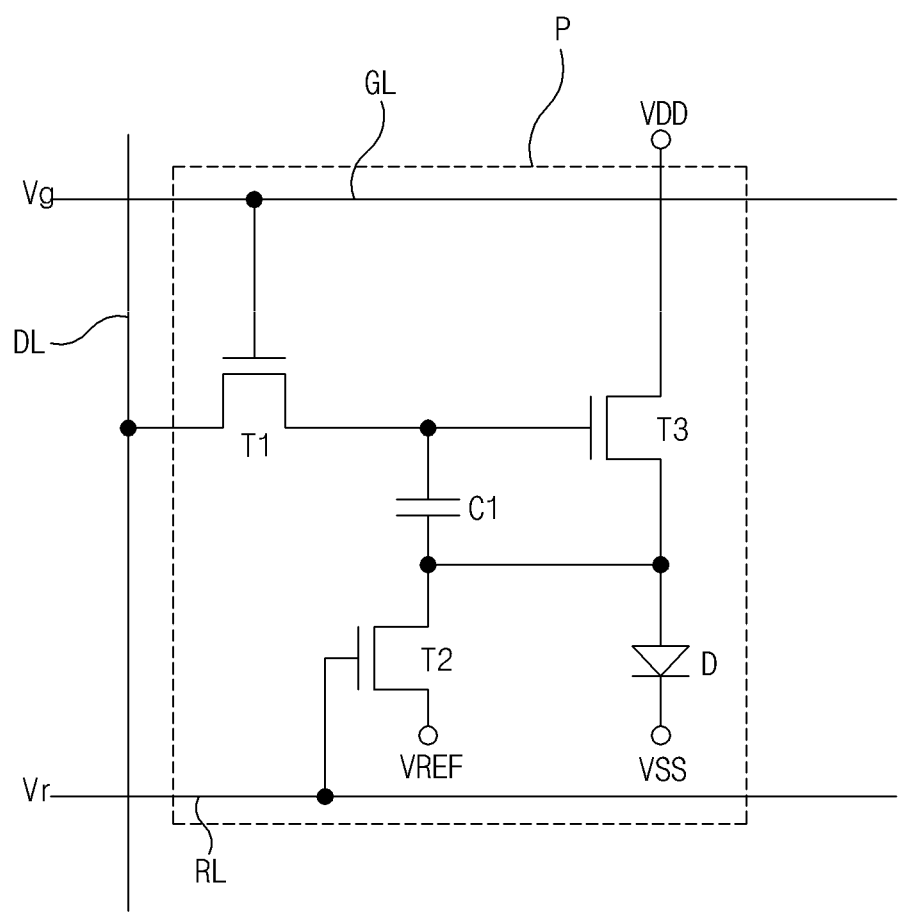
FIG. 9 is a circuit diagram showing a pixel area of an OLED display device, according to an embodiment of the present invention.

FIG. 9 is a circuit diagram showing a pixel area of an OLED display device, according to an embodiment of the present invention, and a pixel structure shown in FIG. 9 can be applied to the first, second, and third embodiments of the present invention.

As shown in FIG. 9, in the pixel area P of the OLED display device, a gate line GL and a reset line RL are formed to be spaced apart from each other in a vertical direction, and a data line DL is formed in a vertical direction to intersect the gate line GL and the reset line RL.

A first transistor T1 is connected to the gate line GL and the data line DL, and the drain of the first transistor T1 is connected to one terminal of a first capacitor C1.

A second transistor T2 is connected to the reset line RL and a reference voltage VREF, a third transistor T3 is connected to a supply voltage VDD and a light-emitting diode D, and the light-emitting diode D is connected to a ground voltage VSS.

The first transistor T1 acts as a switching device for transferring a data signal of the data line DL according to a gate signal from the gate line GL, the second transistor T2 acts to charge the reference voltage VREF to the other terminal of the first capacitor C1 according to a reset signal from the reset line RL, and the third transistor T3 acts as a driving device for transferring current of the supply voltage VDD according to a voltage stored in the terminal of the first capacitor C1 to the light-emitting diode D.

When the pixel area P shown in FIG. 9 is applied to the OLED display devices according to the first, second, and third embodiments, the first, second, and third voltages may be the supply voltage VDD, the ground voltage VSS, and the reference voltage VREF, respectively, and the first, second, and third power link lines may be lines for transferring the supply voltage VDD, the ground voltage VSS, and the reference voltage VREF to each pixel area P.

The first, second, and third embodiments relate to examples of OLED display devices, however, according to another embodiment, a plurality of first power link lines may be formed in a liquid crystal display.

That is, in a liquid crystal display including a liquid crystal panel that displays images, and a gate driver and a data driver that supply gate signals and data signals to the liquid crystal panel, by forming a plurality of first power link lines on the first substrate of the liquid crystal panel, and connecting the plurality of first power link lines to a plurality of first power pads formed between the output pads of the DIC of each gate driver or each data driver, a first voltage can be divided and supplied to the liquid crystal panel.

Consequently, by supplying various voltages through the plurality of power link lines formed between the plurality of output pads of the driving integrated circuit, it is possible to supply various divided voltages to the display panel.

Also, by connecting a part of the plurality of power lines of the display panel to each power link line formed between the output pads of the driving integrated circuit to supply various voltages, it is possible to prevent the plurality of power link lines and the plurality of power lines from being electrically shorted or burnt.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. A display device, comprising:
a display panel including a display area having a plurality of pixel areas, and a non-display area surrounding the display area;
a plurality of first power lines formed on the display area to supply a first voltage to the plurality of pixel areas;
a plurality of first power link lines connected to the plurality of first power lines, and formed on the non-display area; and
a plurality of drivers connected to the display panel, and including a plurality of output pads and a plurality of first power pads, the plurality of first power pads disposed between the plurality of output pads and respectively connected to the plurality of first power link lines,
wherein each driver includes a driving integrated circuit and a film on which the driving integrated circuit is mounted,
wherein each driver includes a first power supply line for receiving the first voltage from an external source, and
wherein the first power supply line is disposed to overlap a first side portion of the driving integrated circuit, and the plurality of output pads and the plurality of first power pads are disposed to overlap a second side portion of the driving integrated circuit opposite to the first side portion.

2. The display device according to claim 1, wherein a plurality of output terminals of the driving integrated circuit are connected to the plurality of output pads, respectively, and the plurality of output pads are connected to a plurality of data lines of the display panel to supply the data signal to the plurality of data lines.

3. The display device according to claim 1, wherein each driver includes a plurality of first secondary power link lines connected to the first power supply line and the plurality of first power link lines for supplying the first voltage.

4. The display device according to claim 3, wherein the plurality of first secondary power link lines are formed on the film or in the driving integrated circuit.

5. The display device according to claim 1, wherein each first power link line is formed to have a number equal to or greater than one and equal to or smaller than a total number of the plurality of output pads.

6. The display device according to claim 1, further comprising:

a plurality of second power lines and a plurality of third power lines formed on the display area to respectively supply a second voltage and a third voltage to the plurality of pixels areas;

a plurality of second power link lines and a plurality of third power link lines, wherein the plurality of second power link lines are connected to the plurality of second power lines and formed on the non-display area, and the plurality of third power link lines are connected to the plurality of third power lines and formed on the non-display area; and a plurality of second power pads and a plurality of third power pads, wherein the plurality of second power pads are disposed between the plurality of output pads and connected to the plurality of second power link lines, respectively, and the plurality of third power pads are disposed between the plurality of output pads and connected to the plurality of third power link lines, respectively.

7. The display device according to claim 6, wherein the plurality of first power link lines, the plurality of second power link lines, and the plurality of third power link lines are arranged alternately, one by one, or three by three.

8. The display device according to claim 1, wherein a plurality of output terminals of the driving integrated circuit are connected to the plurality of output pads, respectively, and the plurality of output pads are connected to a plurality of gate lines of the display panel for supplying the gate signal.

9. The display device according to claim 1, wherein the first voltage is one of a supply voltage VDD, a ground voltage VSS, and a reference voltage VREF, which are used in the plurality of pixel areas.

10. The display device according to claim 1, wherein each neighboring two of the plurality of pixel areas are configured to receive the first voltage through a same one of the plurality of first power lines.

11. The display device according to claim 1, wherein:
each driver includes a first power supply line configured to receive the first voltage from an external source through two power input pads formed at opposite ends of the first power supply line.

12. The display device according to claim 1, wherein the first power link lines are directly connected to the first power pads in a one-to-one correspondence, and supply the first voltage directly to the first power lines.

13. The display device according to claim 1, wherein each neighboring four of the plurality of pixel areas are configured to receive the first voltage through a same one of the plurality of first power lines.

14. The display device according to claim 3, wherein the first power supply line and the first secondary power link lines are disposed in the area corresponding to the driving integrated circuit on the film.

15. The display device according to claim 3, wherein the first secondary power link lines are disposed to overlap the driving integrated circuit.

16. The display device according to claim 1, wherein the plurality of first power pads are configured to supply the first voltage to the plurality of pixel areas through the first power link lines, and
wherein the plurality of output pads receive one of a data signal and a gate signal outputted from the driving integrated circuit and transmit one of the data signal and the gate signal to the plurality of pixel areas.

17. The display device according to claim 1, wherein each of the plurality of first power pads is disposed between adjacent two of the plurality of output pads connected to the driving integrated circuit.

18. The display device according to claim 12, wherein:
the first power lines are directly connected to the first power pads in a one-to-one correspondence; and
the first power lines are disposed between pixels of the plurality of pixel areas in the display area.

* * * * *